(12) United States Patent
Lin

(10) Patent No.: US 7,431,260 B2
(45) Date of Patent: Oct. 7, 2008

(54) WAFER MEASURING FIXTURE

(75) Inventor: Hung-Yen Lin, Hsinchu Cit (TW)

(73) Assignee: Powerchip Semiconductor Corp., Hsinchu (TW)

( * ) Notice: Subject to any disclaimer, the term of this patent is extended or adjusted under 35 U.S.C. 154(b) by 341 days.

(21) Appl. No.: 11/162,273

(22) Filed: Sep. 5, 2005

(65) Prior Publication Data

US 2007/0051191 A1    Mar. 8, 2007

(51) Int. Cl.
*G01M 19/00* (2006.01)
(52) U.S. Cl. ..................... 248/542; 73/865.8
(58) Field of Classification Search ........ 73/865.8–866; 248/542
See application file for complete search history.

(56) References Cited

U.S. PATENT DOCUMENTS

| | | | | |
|---|---|---|---|---|
| 3,572,400 | A | * | 3/1971 | Hance et al. .................... 141/1 |
| 4,228,428 | A | * | 10/1980 | Niedermeyer ........... 248/542 X |
| 5,092,557 | A | * | 3/1992 | Sawatzki ..................... 248/542 |
| 6,545,752 | B1 | * | 4/2003 | Swan et al. .............. 356/237.4 |
| 2004/0225385 | A1 | * | 11/2004 | Takagi et al. .................. 700/90 |

* cited by examiner

*Primary Examiner*—Thomas P Noland
(74) *Attorney, Agent, or Firm*—Jianq Chyun IP Office

(57) ABSTRACT

A wafer-measuring fixture suitable for carrying a broken wafer is described. The wafer-measuring fixture comprises a base having a carrying component. The carrying component is used to hold the broken wafer. Furthermore, a plurality of scale marks is set around the carrying component to mark the broken positions on the wafer.

6 Claims, 3 Drawing Sheets

WAFER MEASURING FIXTURE

BACKGROUND OF THE INVENTION

1. Field of the Invention

The present invention relates to an apparatus for holding a broken wafer in a factory. More particularly, the present invention relates to a wafer-measuring fixture.

2. Description of the Related Art

As the fabrication of integrated circuit devices advances toward greater density, the dimension of devices defined on a silicon substrate has shrunk so much that the associated circuit design has become very sophisticated. As a result, a considerable number of steps need to be carried out to form the required integrated circuits on the silicon substrate. More specifically, the fabricating process of a particular batch of silicon substrates from raw input to the end of inspection and delivery will be processed among various processing stations.

In the process of fabricating the integrated circuit devices, wafers are often found broken. To prevent the defect from affecting the operation of the processing stations and any subsequent processing operation, the operators will place the broken wafer to a plastic bag and perform necessary inspection as well as analysis to find the actual reason of defects hereafter.

However, the inappropriate management of the broken wafers conducted by individual operator may result in some issues. Placing a broken wafer in a general-purpose plastic bag may bring about difficulties of maintenance. Therefore, the wafer may have secondary damages before any inspection is performed, which may lead to erroneous determination of the reason of defects and to failure of improvement. Consequently, a lower yield rate and higher production cost of the devices will be incurred.

SUMMARY OF THE INVENTION

Accordingly, at least one objective of the present invention is to provide a wafer-measuring fixture that can prevent a broken wafer from secondary damages and rapidly perform a measurement to find the actual reason of defects.

To achieve these and other advantages and in accordance with the purpose of the invention, as embodied and broadly described herein, the invention provides a wafer-measuring fixture suitable for carrying a broken wafer. The wafer-measuring fixture comprises a base having a carrying component. The carrying component supports the broken wafer. Furthermore, a plurality of scale marks is set around the carrying component to mark the broken positions of the wafer.

According to the embodiment of the present invention, the wafer-measuring fixture further includes a cover hinged to one side of the base. The other side of the cover has at least a groove. The aforementioned cover is fabricated using acrylic material, for example.

According to the embodiment of the present invention, the wafer-measuring fixture further includes a loose-leaf connective component. The loose-leaf connective component is hinged between the cover and the base.

According to the embodiment of the present invention, the wafer-measuring fixture further includes at least two magnets which are respectively fixed on the base and the cover and disposed at corresponding locations.

According to the embodiment of the present invention, the side of the aforementioned base has at least a groove. The base is fabricated using acrylic material, for example.

According to the embodiment of the present invention, the aforementioned carrying component is at least equal in size to the broken wafer.

The present invention also provides an alternative wafer-measuring fixture suitable for carrying a broken wafer. The wafer-measuring fixture comprises a base and a cover. The base has a carrying component for supporting the broken wafer. The cover is hinged to one side of the base. Furthermore, a plurality of scale marks is set around the cover to mark the broken positions on the wafer.

According to the embodiment of the present invention, the other side of the aforementioned cover has at least a groove. The cover is fabricated using acrylic material, for example.

According to the embodiment of the present invention, the wafer-measuring fixture further includes a loose-leaf connective component. The loose-leaf connective component is hinged between the cover and the base.

According to the embodiment of the present invention, the wafer-measuring fixture further includes at least two magnets which are respectively fixed on the base and the cover and disposed at corresponding locations.

According to the embodiment of the present invention, the side of the aforementioned base has at least a groove. The base is fabricated using acrylic material, for example.

According to the embodiment of the present invention, the aforementioned carrying component is at least equal in size to the broken wafer.

In the present invention, a wafer-measuring fixture is used instead of a plastic bag to hold a broken wafer. Thus, the broken wafer can be well-maintained and secondary damages to the wafer which may lead to an erroneous determination of the reason of defects can be eliminated. Furthermore, the scale marks around the wafer-measuring fixture can help quickly locate the broken positions in the wafer and find the reason of defects to prevent further damages. In other words, the present invention provides a means of increasing the yield and lowering the production cost by reducing damages.

The above and other features of the present invention will be better understood from the following detailed description of the preferred embodiments of the invention which is provided in communication with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
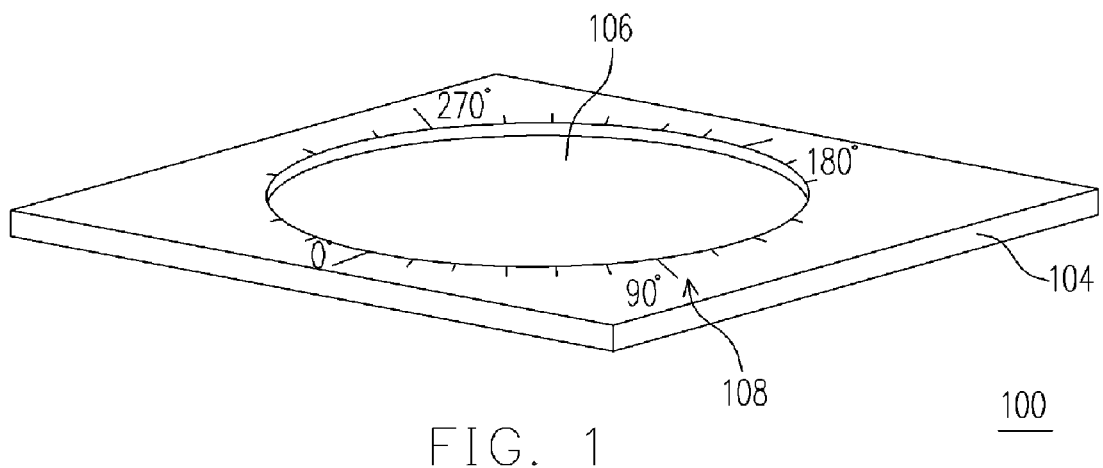
FIG. 1 is a perspective view of a wafer-measuring fixture according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
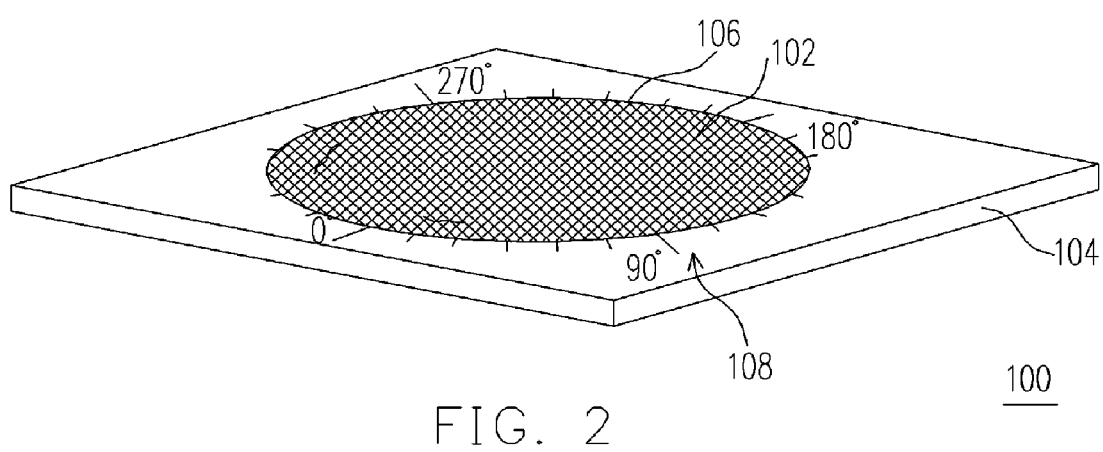
FIG. 2 is a perspective view of the wafer-measuring fixture according to FIG. 1 after inserting a broken wafer.

FIG. 1 is a perspective view of a wafer-measuring fixture according to one embodiment of the present invention. FIG. 2 is a perspective view of the wafer-measuring fixture according to FIG. 1 after inserting a broken wafer.

As shown in FIGS. 1 and 2, the wafer-measuring fixture 100 provided by the present invention can be used for carrying a broken wafer 102. Here, the broken wafer 102 refers to a wafer having defects such as cracks or splits. The wafer-measuring fixture 100 has a base 104 fabricated using acrylic material, other suitable plastic materials, or even materials such as wood or glass, but most preferably acrylic material.

The base 104 has a carrying component 106 for holding the broken wafer 102. The carrying component 106 is at least equal in size to the broken wafer 102. In other words, the size of the carrying component 106 is at least equal to the 5-inch, 6-inch, 8-inch, and 12-inch wafer manufactured by most semiconductor plants. Obviously, the present invention is not limited to wafers which can be fabricated by current processes. In general, the size of the carrying component 106 may be changed according to new processing development.

Furthermore, a plurality of scale marks 108 is disposed around the carrying component 106 to mark the broken positions on the broken wafer 102. The scale marks 108 can be equidistantly laid angular markings or other suitable types of markings. The range of the angular markings is from 0° to 360°, for example. Through the scale marks 108, an operator can rapidly perform a measurement to find the cracks on the broken wafer 102. Subsequently, by collecting and analyzing the information about the cracks, the reason of defects in the wafers can be quickly found.

Figure 3:
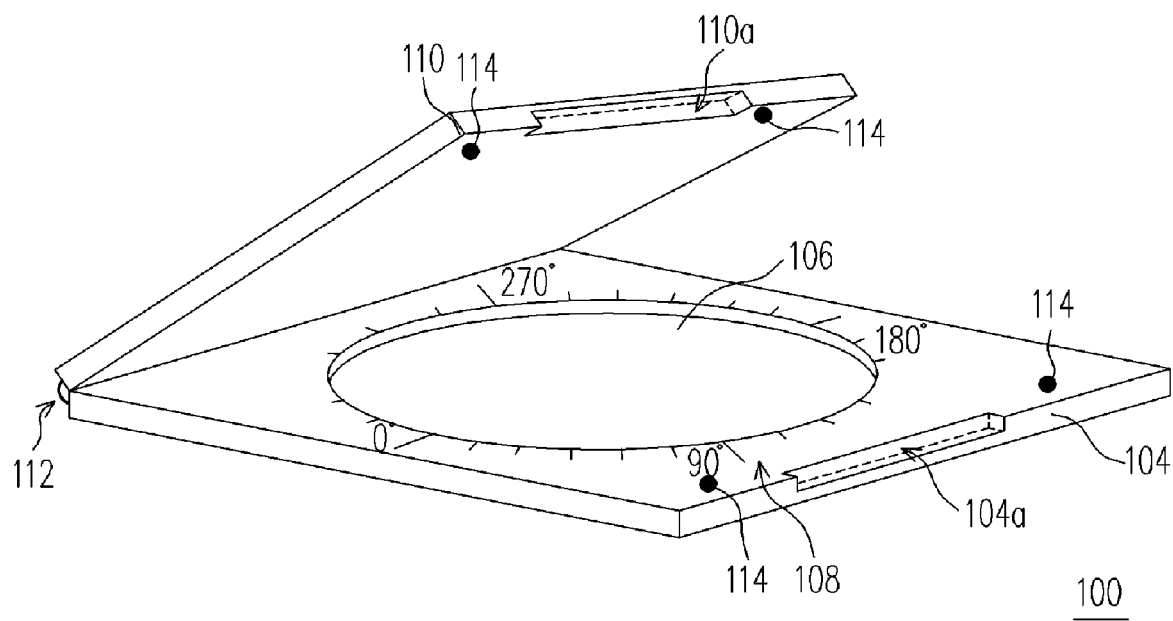
FIG. 3 is a perspective view of a wafer-measuring fixture according to another embodiment of the present invention.
Figure 4:
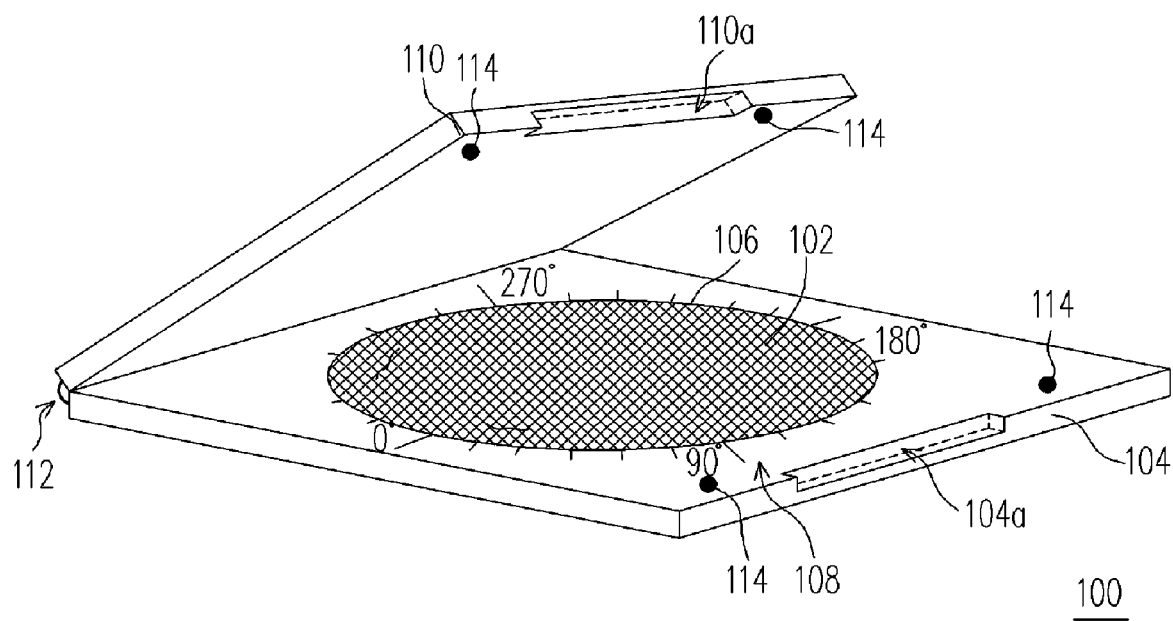
FIG. 4 is a perspective view of the wafer-measuring fixture according to FIG. 3 after inserting a broken wafer.

FIG. 3 is a perspective view of a wafer-measuring fixture according to another embodiment of the present invention. FIG. 4 is a perspective view of the wafer-measuring fixture according to FIG. 3 after inserting a broken wafer.

In the embodiment as shown in FIGS. 3 and 4, the wafer-measuring fixture 100 further includes a cover 110 hinged to one side of the base 104. The cover 110 serves to protect the broken wafer 102 against secondary damages which may affect the determination of the actual reason of defects in the broken wafer 102. The cover 110 can be fabricated using acrylic material or other suitable plastic materials, for example, but preferably acrylic material. Furthermore, the wafer-measuring fixture 100 may further include a loose-leaf connective component 112 between the cover 110 and the base 104 so that the cover 110 can rotate relative to the base 104. In addition, at least a magnet 114 is fixed on the base 104 and another magnet is fixed on a corresponding position of the cover 110. Hence, the fixed magnets 114 on the base 104 and the cover 110 are attracted to each other and prevent the base 104 and the cover 110 from separating again once they are closed. When the broken wafer 102 must be removed from the wafer-measuring fixture 100, the magnets 114 also facilitate the lifting of the cover 110 and prevent the broken wafer 102 from any secondary damages due to the application of an excessive force.

In another embodiment as shown in FIGS. 3 and 4, with a view to facilitating the opening and closing of the wafer-measuring fixture 100 and preventing the broken wafer 102 from secondary damages, one side of the cover 110 has at least a groove 110a. Similarly, one side of the base 104 can have at least a groove 104a. Obviously, it is feasible to simultaneously have at least a groove 104a on one side of the base 104 and at least a groove 110a on one side of the cover 110 to facilitate the opening or closing of the wafer-measuring fixture 100.

Figure 5:
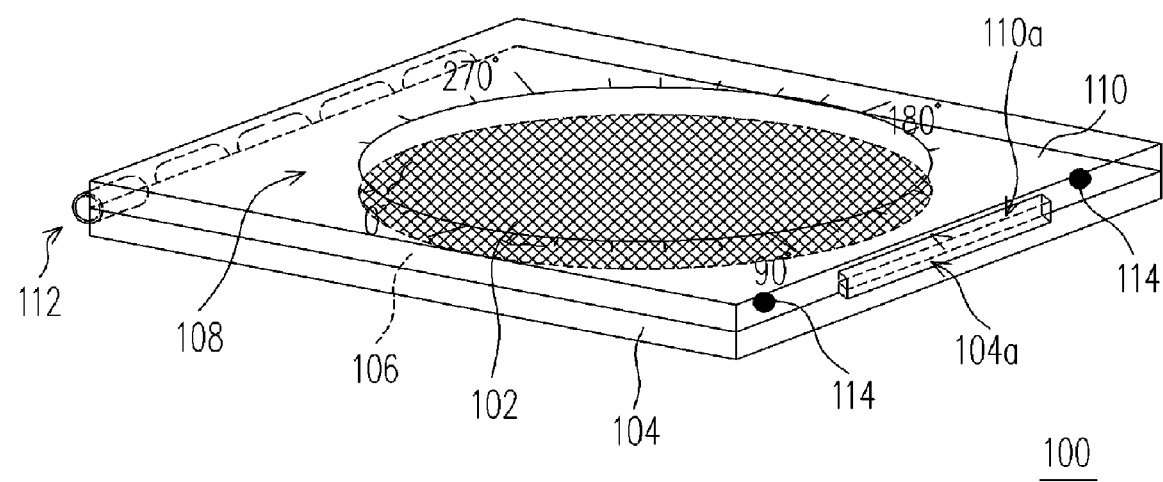
FIG. 5 is a perspective view of a wafer-measuring fixture according to yet another embodiment of the present invention.

In yet another embodiment as shown in FIG. 5, the scale marks 108 of the wafer-measuring fixture 100 are disposed in the cover 114 around the corresponding carrying component 106 to mark the broken positions on the broken wafer 102. Therefore, an operator can rapidly spot the cracks on the broken wafer 102 through the scale marks 108 and determine the actual reason of such defects after collecting and analyzing the information about the cracks on wafers.

It should be noted that all related components described in the aforementioned diagrams should not be used to limit the scope of the present invention. In particular, the locations of the cover, the base, the grooves, the magnets, or the types of connection between the cover and the base may be modified according to the actual conditions.

In summary, the wafer-measuring fixture 100 in the present invention helps rapidly spot the cracks on a broken wafer 102 and quickly find the reason of defects in wafers so that damages can be minimized. Therefore, the yield of the production can be increased and the cost of production can be reduced. On the other hand, the wafer-measuring fixture 100 in the present invention can help maintain broken wafers and prevent broken wafers from secondary damages due to conventional storage methods such as disposing wafers in a plastic bag, which might result in the confusion of the reason of defects. In addition, the wafer-measuring fixture 100 is not limited to hold the 5-inch, 6-inch, 8-inch and 12-inch wafers which are currently produced by most manufacturers. The fixture can be modified to fit any possible type of wafer developed in the future.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer-measuring fixture suitable for carrying a broken wafer, comprising:
a base having a carrying component, wherein the carrying component supports the broken wafer and has a plurality of scale marks disposed around to locate the position of any cracks on the broken wafer.

2. The wafer-measuring fixture of claim 1, wherein the wafer-measuring fixture further comprises a cover hinged to one side of the base.

3. The wafer-measuring fixture of claim 2, wherein the wafer-measuring fixture further comprises a loose-leaf connection component hinged between the cover and the base.

4. The wafer-measuring fixture of claim 1, wherein one side of the base comprises at least a groove.

5. The wafer-measuring fixture of claim 1, wherein the material constituting the base comprises an acrylic compound.

6. The wafer-measuring fixture of claim 1, wherein the carrying component is at least equal in size to the broken wafer.

* * * * *